US007435936B1

(12) United States Patent
Pawlak et al.

(10) Patent No.: US 7,435,936 B1

(45) Date of Patent: Oct. 14, 2008

(54) LIGHT ANALYZER DEVICE AND METHOD FOR DETECTING OBJECTS UTILIZING THE LIGHT ANALYZER DEVICE

(75) Inventors: Andrzej M. Pawlak, Rochester Hills, MI (US); David K. Lambert, Sterling Heights, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/735,606

(22) Filed: Apr. 16, 2007

(51) Int. Cl.
*H01L 27/00* (2006.01)

(52) U.S. Cl. ................................ 250/208.1; 250/201.5

(58) Field of Classification Search ............. 250/208.1, 250/201.5, 201.2, 226; 348/208.99, 207.99, 348/222.1; 396/456, 55, 121, 452
See application file for complete search history.

(56) References Cited

U.S. PATENT DOCUMENTS 6,367,991 B1 * 4/2002 Garfinkle et al. ............ 396/639

* cited by examiner

*Primary Examiner*—Que T Le
(74) *Attorney, Agent, or Firm*—Paul L. Marshall

(57) ABSTRACT

A light analyzer device and a method for detecting objects utilizing the light analyzer device are provided. The light analyzer device includes a focal plane array configured to receive the light that has passed through a light filter and to generate a first digital image based on the light that has passed through the light filter. The light analyzer device further includes a microprocessor operably coupled to the focal plane array. The microprocessor is configured to receive the first digital image, and to determine whether the first digital image corresponds to a stored digital image. The light analyzer device further includes a light emitting device operably coupled to the microprocessor. The microprocessor is further configured to induce the light emitting device to output a visual indicator indicating that the first digital image corresponds to the stored digital image.

17 Claims, 3 Drawing Sheets

10
12
14
16
18
20
21
22
24
26
27
28
29
30
31
33
LIGHT FILTER
FOCAL PLANE ARRAY
MICROPROCESSOR
MEMORY DEVICE
POWER SOURCE
ELECTRICAL SPEAKER
VIBRATABLE DEVICE
LIGHT FROM SCENE
LIGHT FROM SCENE
SCENE

LIGHT ANALYZER DEVICE AND METHOD FOR DETECTING OBJECTS UTILIZING THE LIGHT ANALYZER DEVICE

BACKGROUND

This application relates to a light analyzer device and a method for detecting objects utilizing the light analyzer device.

An infrared imaging device has been developed that generates an image on a display monitor corresponding to a scene during low light level conditions. A user of the infrared imaging device, however, may not be able to readily identify desired objects in the image. This is a significant drawback to a user attempting to utilize the infrared imaging device to view desired objects in the scene. The inventors herein have also recognized that the user may also want to be alerted that a specific type of object is being imaged without needing to focus their attention on a visual display.

Accordingly, the inventors herein have recognized a need for a light analyzer device and a method that minimizes and/or eliminates the above mentioned deficiencies.

SUMMARY

A light analyzer device in accordance with an exemplary embodiment is provided the light analyzer device includes a light filter configured to receive light and to allow light within a predetermined wavelength range therein to pass through the light filter. The light analyzer device further includes a focal plane array configured to receive the light that has passed through the light filter and to generate a first digital image based on the light that has passed through the light filter. The light analyzer device further includes a microprocessor operably coupled to the focal plane array. The microprocessor is configured to receive the first digital image, and to determine whether the first digital image corresponds to a stored digital image. The light analyzer device further includes a light emitting device operably coupled to the microprocessor. The microprocessor is further configured to induce the light emitting device to output a visual indicator indicating that the first digital image corresponds to the stored digital image, when the microprocessor determines the first digital image corresponds to the stored digital image.

A method for detecting objects utilizing a light analyzer device in accordance with another exemplary embodiment is provided. The light analyzer device has a light filter, a focal plane array disposed proximate the light filter, a microprocessor operably coupled to the focal plane array, and alight emitting device operably coupled to the microprocessor. The method includes receiving light at the light filter and filtering the light such that only light within a predetermined wavelength range passes through the light filter. The method further includes receiving the light that has passed through the light filter at the focal plane array. The method further includes generating a first digital image based on the light received at the focal plane array and sending the first digital image to the microprocessor, utilizing the focal plane array. The method further includes determining whether the first digital image corresponds to a stored digital image, utilizing the microprocessor. The method further includes outputting a visual indicator from the light emitting device indicating that the first digital image corresponds to the stored digital image, when the microprocessor determines the first digital image corresponds to the stored digital image.

A light analyzer device in accordance with another exemplary embodiment is provided. The light analyzer device includes a light filter configured to receive light and to allow light within a predetermined wavelength range therein to pass through the light filter. The light analyzer device further includes a focal plane array configured to receive the light that has passed through the light filter and to generate a first digital image based on the light that has passed through the light filter. The light analyzer device further includes a microprocessor operably coupled to the focal plane array. The microprocessor is configured to receive the first digital image, and to determine whether the first digital image corresponds to a stored digital image. The light analyzer device further includes an electrical speaker operably coupled to the microprocessor. The microprocessor is further configured to induce the electrical speaker to output a second indicating that the first digital image corresponds to the stored digital image, when the microprocessor determines the first digital image corresponds to the stored digital image.

A light analyzer device in accordance with another exemplary embodiment is provided. The light analyzer device includes a light filter configured to receive light and to allow light within a predetermined wavelength range therein to pass through the light filter. The light analyzer device further includes a focal plane array configured to receive the light that has passed through the light filter and to generate a first digital image based on the light that has passed through the light filter. The light analyzer device further includes a microprocessor operably coupled to the focal plane array. The microprocessor is configured to receive the first digital image, and to determine whether the first digital image corresponds to a stored digital image. The light analyzer device further includes a vibratable device operably coupled to the microprocessor. The microprocessor is further configured to induce the vibratable device to vibrate indicating that the first digital image corresponds to the stored digital image, when the microprocessor determines the first digital image corresponds to the stored digital image.

DETAILED DESCRIPTION OF EXEMPLARY EMBODIMENTS

Figure 1:
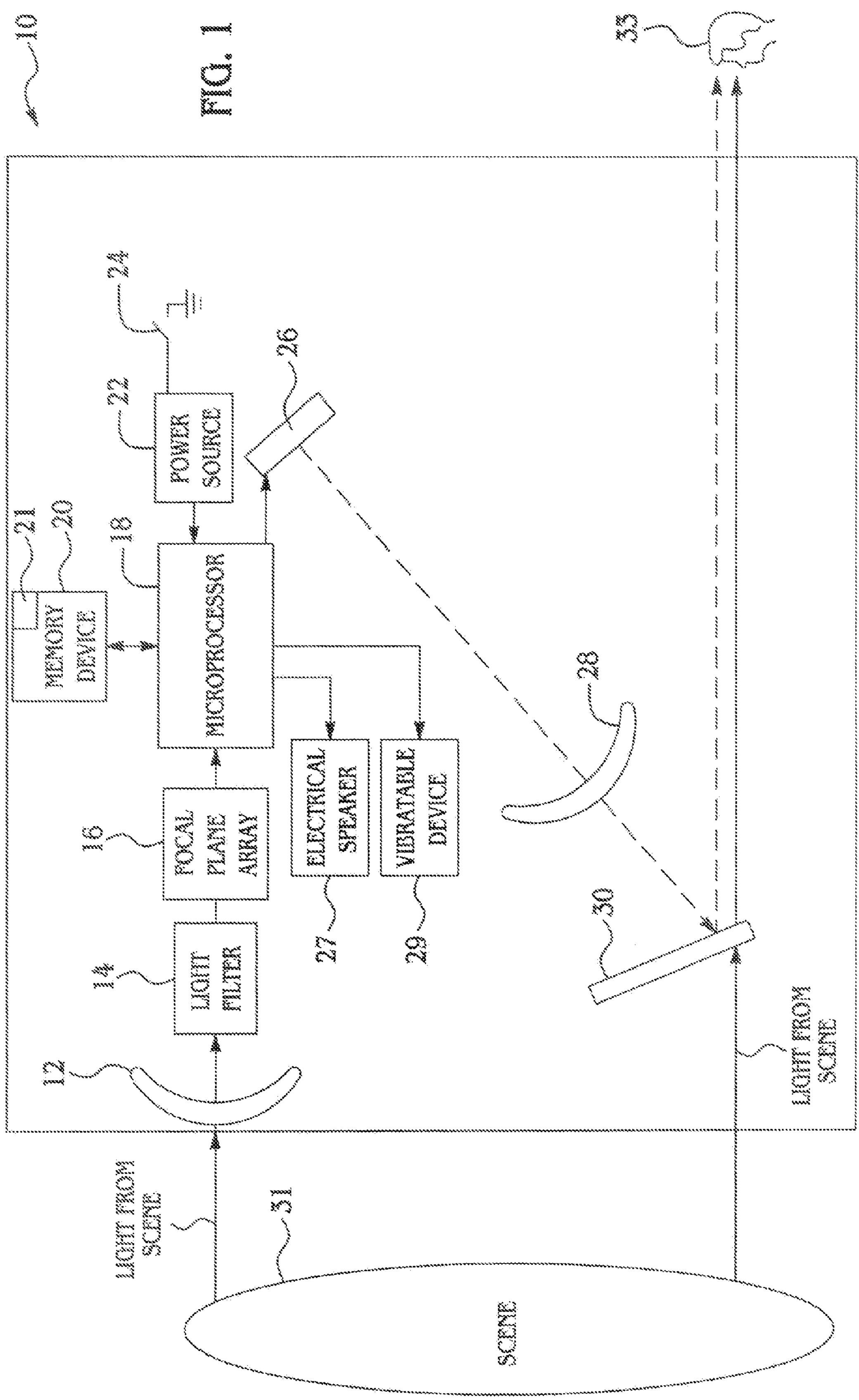
FIG. 1 is a schematic of a light analyzer device in accordance with an exemplary embodiment; and FIGS, 2-3 are flowcharts of a method for detecting objects utilizing the light analyzer device of FIG. 1.

Referring to FIG. 1, a light analyzer device 10 in accordance with an exemplary embodiment is shown. The light analyzer device 10 includes a focusing optical lens 12, a light filter 14, a focal plane array 16, a microprocessor 18, a memory device 20, a voltage source 22, a light emitting device 26, an electrical speaker 27, a vibratable device 29, a projection optical lens 28, and a beam splitter 30.

The focusing optical lens 12 is provided to receive light from an environment scene 31 and to focus the light on the light filter 14. The light filter 14 receives the light from the focusing optical lens 12 and only allows light within a predetermined wavelength range to pass through the light filter 14. For example, in one exemplary embodiment, the predetermined wavelength range is the infrared wavelength range. Of course, the predetermined wavelength range could be outside of the infrared wavelength range.

The focal plane array 16 is disposed proximate the light filter 14. In one exemplary embodiment, the focal plane array 16 is disposed approximately one focal length behind the focusing lens 12, so that light from a scene is focused onto the focal plane array 16. The light filter 14 is disposed between the focusing lens 12 and the focal plane array 16 so that light that reaches the focal plane array 16 first passes through the light filter 14. During operation, the focal plane array 16 receives the light from the light filter 14 and generates a digital image based on the light. The focal plane array 16 is further transmits the digital image to the microprocessor 18.

The microprocessor 18 is provided to receive the digital image from the focal plane array 16 and to determine whether the received digital image corresponds to one of a plurality of digital images stored in the memory device 20. For example, a stored digital image 21 in the memory device 20 can comprise one of image of a pedestrian proximate a roadway, an image of the person riding a bicycle, an image of a child, and an image of a dog. As illustrated, the microprocessor 18 is operably coupled to the focal plane array 16, the memory device 20, the power source 22, and the light emitting device 26. During operation, when the microprocessor 18 receives the digital image from the focal plane array 16, the microprocessor 18 retrieves one or more stored digital images from the memory device 20. Thereafter, the microprocessor 18 compares the digital image from the focal plane array 16 to each of the retrieved store digital images to determine whether any portion of the received digital image from the focal plane array has a relatively high degree of correlation to one of the retrieved stored digital images. If the degree of correlation between any portion of the digital image received from the focal plane array 16 and a stored digital image is greater than a threshold correlation value, the digital image received from the focal plane array 16 corresponds to the stored digital image. In this event, the microprocessor 18 performs the following tasks: (i) generates a visual indicator indicating that a predefined object has been detected in the digital image received from the focal plane array 16, (ii) generates a signal to induce the electrical speaker 27 to emit a sound indicating the predefined object has been detected in the digital image received from the focal plane array 16, and (iii) generates another signal to induce the vibratable device 29 to vibrate indicating the predefined object has been detected in the digital image received from the focal plane array 16. Further, the microprocessor 18 generates signals to induce the light emitting device 26 to display the digital image received from the focal plane array 16.

The voltage source 22 is configured to supply an operational voltage to the microprocessor 18. In particular, when the switch 24 operably coupled to the voltage source 22 has a closed operational position, the microprocessor 18 receives the operational voltage from the voltage source 22. Alternately, when the switch 24 has an open operational position, the microprocessor 18 does not receive the operational voltage from the voltage source 22.

The light emitting device 26 is provided to display a digital image received from the microprocessor 18, and a visual indicator, such as a display icon or textual message, generated by the microprocessor 18 if applicable. In one exemplary embodiment, the light device 26 comprises a display device. As illustrated, the light emitting device 26 is operably coupled to the microprocessor 18.

The electrical speaker 27 is provided to emit a sound indicating a predefined object has been detected in the digital image received from the focal plane array 16, in response to a control signal from the microprocessor 18.

The vibratable device 29 is provided to vibrate indicating a predefined object has been detected in the digital image received from the focal plane array 16, in response to a control signal from the microprocessor 18.

The projection optical lens 28 is disposed proximate the light emitting device 26. In one exemplary embodiment, the projection optical lens 28 is disposed a distance equal to one focal length of the lens 28 from the display device 26. The projection optical lens 28 is configured to receive light corresponding to a digital image from the light emitting device 26 and a visual indicator, and to project the light onto the beam splitter 30. It should be noted that in one exemplary embodiment, the focal length of lens 12 is approximately equal to the focal length of lens 28, and the dimensions of an object displayed on the display device 26 are approximately equal to dimensions of the real image of the object focused by the focusing lens 12 on the focal plane array 16.

The beam splitter 30 is provided to reflect light received from the light emitting device 26 in a first direction towards a human observer 33. The beam splitter 30 is further provided to transmit visible light from a scene 31 and to pass the visible light therethrough in the first direction towards the human observer 33. Thus, the human observer 33 looking at the beam splitter 30 can view visible light corresponding to the scene 31, a visible representation of the infrared light corresponding to the scene 31, and a visual indicator indicating whether a desired object is in the view of the scene 31. The light analyzer device 10 is aligned (for example by adjusting the angular orientation of beam splitter 30 along two orthogonal axes) so that the projected scene from display device 26, as seen by an observer looking into the beam splitter 30, overlays the visible scene as observed through the beam splitter 30.

The detectable light wavelength range of the light filter 14 is chosen to match the intended function of the light analyzer device 10. For example, when the light analyzer device 10 utilized to detect pedestrians standing near a roadway, the device 10 may use a light filter 14 that passes the thermal black-body peak radiation therethrough, near a 10 micron wavelength, from a source a human body temperature, but not transmit light wavelengths shorter than three microns. As another example, when the light analyzer device 10 is utilized to detect a leak of a specific gas from a container or pipe, the device 10 may use a light filter that only transmits a band of infrared light that is absorbed by the specific gas. The known infrared absorption spectrum of the gas would be utilized to select the light filter 14.

Figure 2:
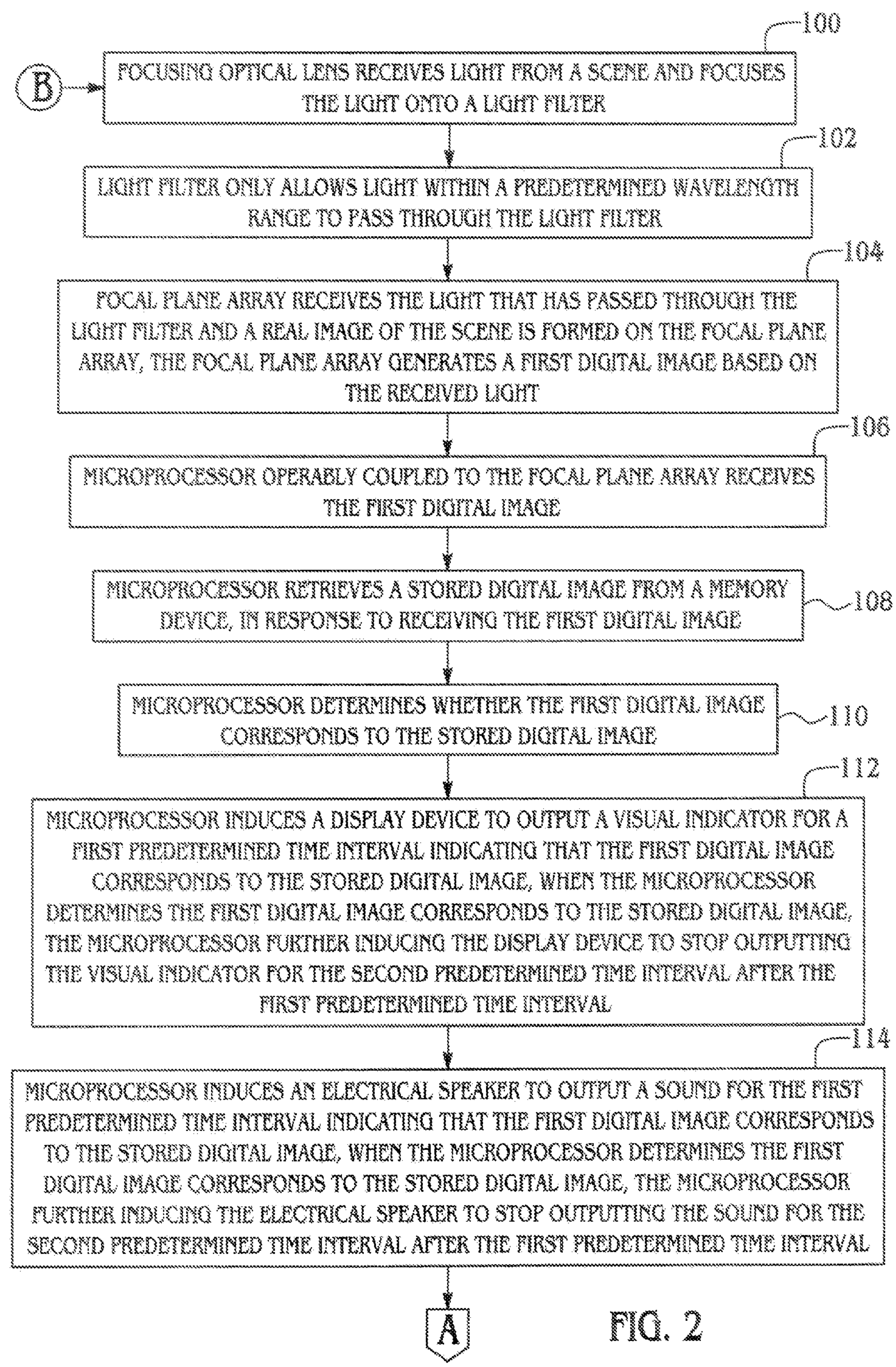
Figure 3:
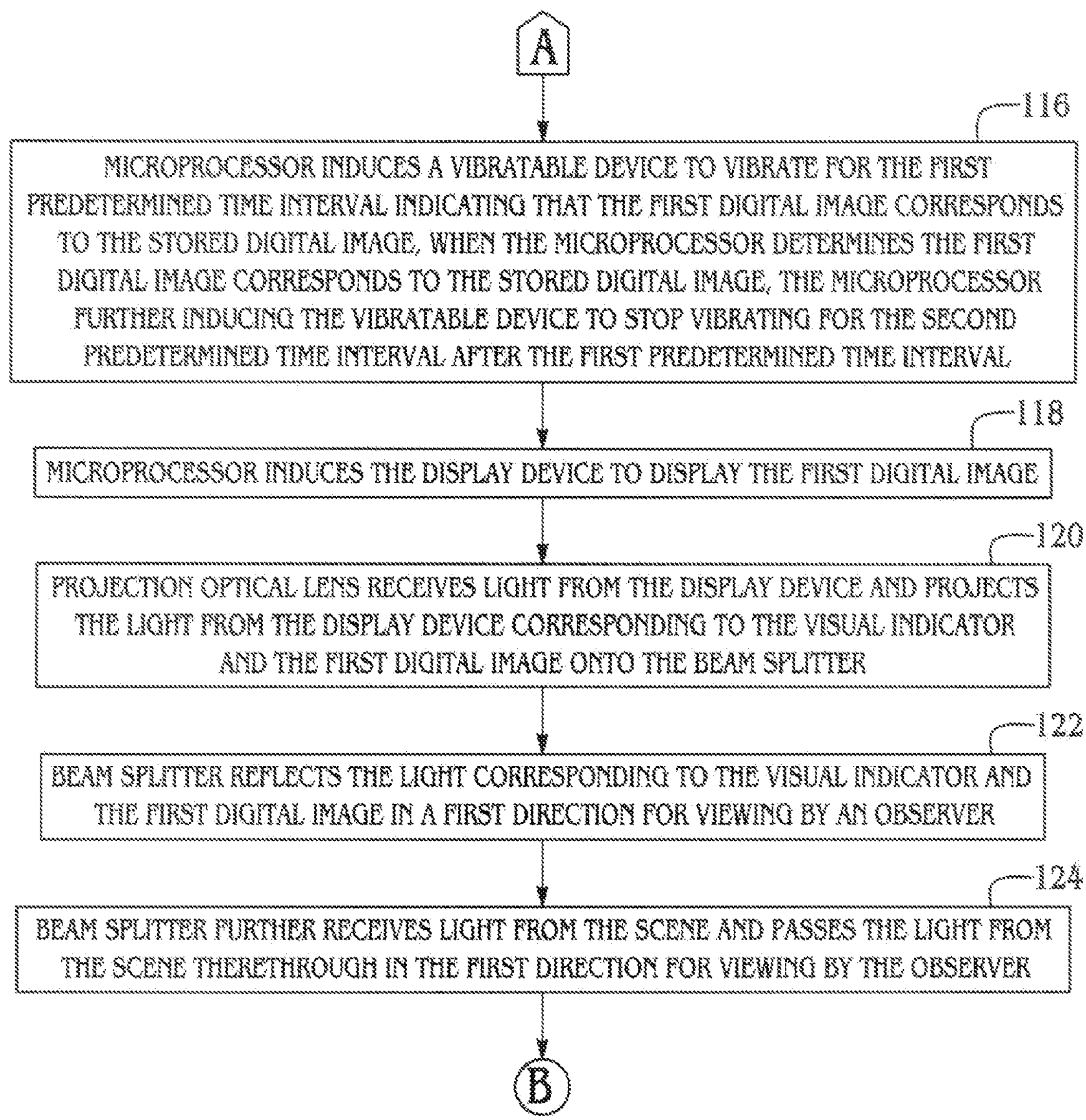

Referring to FIGS. 2-4, a flowchart of a method for detecting objects utilizing the light analyzer device 10 in accordance with another exemplary embodiment will now be explained.

At step 100, the focusing optical lens 12 receives light from a scene 31 and focuses the light onto the light filter 14.

At step 102, the light filter 14 only allows light within a predetermined wavelength range to pass through the light filter 14. In one exemplary embodiment, the predetermined wavelength range is an infrared wavelength range.

At step 104, the focal plane array 16 receives the light that has passed through the light filter 14, and a real image of the scene is formed on the focal plane array 16. The focal plane array 16 generates a first digital image based on the received light.

At step 106, the microprocessor 18 operably coupled to the focal plane array 16 receives the first digital image.

At step 108, the microprocessor 18 retrieves a stored digital image from a memory device 20, in response to receiving the first digital image.

At step 110, the microprocessor 18 determines whether the first digital image corresponds to the stored digital image.

At step 112, the microprocessor 18 induces the display device 26 to output a visual indicator for a first predetermined time interval indicating that the first digital image corresponds to the stored digital image, when the microprocessor 18 determines the first digital image corresponds to the stored digital image. In one exemplary embodiment, the visual indicator is an icon. In another exemplary embodiment, the visual indicator is a textual message. The microprocessor 18 further induces the display device 26 to stop outputting the visual indicator for a second predetermined time interval after the first predetermined time interval.

At step 114, the microprocessor 18 induces the electrical speaker 27 to output a sound for the first predetermined time interval indicating that the first digital image corresponds to the stored digital image, when the microprocessor 18 determines the first digital image corresponds to the stored digital image. The microprocessor 18 further induces the electrical speaker 27 to stop outputting the sound for the second predetermined time interval after the first predetermined time interval.

At step 116, the microprocessor 18 induces the vibratable device 29 to vibrate for the first predetermined time interval indicating that the first digital image corresponds to the stored digital image, when the microprocessor 18 determines the first digital image corresponds to the stored digital image. The microprocessor 18 further induces the vibratable device 29 to stop vibrating for the second predetermined time interval after the first predetermined time interval.

At step 118, the microprocessor 18 induces the display device 26 to display the first digital image.

At step 120, the projection optical lens 28 receives light from the display device 26 and projects the light from the display device 26 corresponding to the visual indicator and the first digital image onto the beam splitter 30.

At step 122, the beam splitter 30 reflects the light corresponding to the visual indicator and the first digital image in a first direction for viewing by an observer.

At step 124, the beam splitter 30 further receives light from the scene 31 and passes the light from the scene 31 therethrough the first direction for viewing by the observer. After step 124, the method returns to step 100.

The light analyzer device and the method for detecting objects utilizing the light analyzer device provide a substantial advantage over other devices and methods. In particular, the light analyzer device and the method provide a technical effect of indicating when a scene has a desired object therein by analyzing digital images corresponding to the scene.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed for carrying this invention, but that the invention will include all embodiments falling within the scope of the appended claims. Moreover, the use of the terms, first, second, etc. are used to distinguish one element from another. Further, the use of the terms a, an, etc. do not denote a limitation of quantity, but rather denote the presence of at least one of the reference items.

What is claimed is:

1. A light analyzer device, comprising:

a light filter configured to receive light and to allow light within a predetermined wavelength range therein to pass through the light filter;

a focal plane array configured to receive the light that has passed through the light filter and to generate a first digital image based on the light that has passed through the light filter;

a microprocessor operably coupled to the focal plane array, the microprocessor configured to receive the first digital image, and to determine whether the first digital image corresponds to a stored digital image; and a light emitting device operably coupled to the microprocessor, the microprocessor being further configured to induce the light emitting device to output a visual indicator indicating that the first digital image corresponds to the stored digital image, when the microprocessor determines the first digital image corresponds to the stored digital image.

2. The light analyzer device of claim 1, wherein the microprocessor is further configured to retrieve the stored digital image from a memory device operably coupled to the microprocessor.

3. The light analyzer device of claim 1, further comprising:

a projection optical lens being configured to project light from the light emitting device corresponding to the visual indicator onto a beam splitter, and the beam splitter being configured to reflect the light corresponding to the visual indicator in a first direction for viewing by an observer, the beam splitter being further configured to transmit light from a scene in the first direction.

4. The light analyzer device of claim 1, wherein the light emitting device comprises a display device, the microprocessor is further configured to induce the display device to display the first digital image.

5. The light analyzer device of claim 4, wherein the projection optical lens is further configured to project light from the light emitting device corresponding to the first digital image onto a beam splitter; and the beam splitter being configured to reflect the light corresponding to the first digital image in a first direction for viewing by an observer, the beam splitter being further configured to transmit light from a scene therethrough in the first direction.

6. The light analyzer device of claim 1, further comprising a focusing optical lens configured to focus the light onto the light filter.

7. The light analyzer device of claim 1, wherein the microprocessor is further configured to induce the light emitting device to output the visual indicator for a first predetermined time interval after the microprocessor determines that the first digital image corresponds to the stored digital image.

8. The light analyzer device of claim 7, wherein the microprocessor is further configured to prevent the light emitting device from outputting the visual indicator for a second predetermined time interval after the first predetermined time interval.

9. The light analyzer device of claim 1, wherein the stored digital image corresponds to one of an image of a pedestrian proximate a roadway, an image of a person riding a bicycle, an image of a child, and an image of a dog.

10. A method for detecting objects utilizing a light analyzer device, the light analyzer device having a light filter, a focal plane array disposed proximate the light filter, a microprocessor operably coupled to the focal plane array, and a light emitting device operably coupled to the microprocessor, the method comprising:

receiving light at the light filter and filtering the light such that only light within a predetermined wavelength range passes through the light filter;

receiving the light that has passed through the light filter at the focal plane array;

generating a first digital image based on the light received at the focal plane array and sending the first digital image to the microprocessor, utilizing the focal plane array;

determining whether the first digital image corresponds to a stored digital image, utilizing the microprocessor; and outputting a visual indicator from the light emitting device indicating that the first digital image corresponds to the stored digital image, when the microprocessor determines the first digital image corresponds to the stored digital image.

11. The method of claim 10, further comprising retrieving the stored digital image from a memory device operably coupled to the microprocessor.

12. The method of claim 10, further comprising:

projecting light from the light emitting device corresponding to the visual indicator onto the beam splitter, utilizing a projection optical lens;

reflecting the light corresponding to the visual indicator in a first direction from a beam splitter for viewing by an observer; and transmitting light from a scene through the beam splitter in the first direction.

13. The method of claim 10, wherein the light emitting device comprises a display device, the method further comprising displaying the first digital image on the display device.

14. The method of claim 13, wherein the method further comprises:

projecting light from the display device corresponding to the first digital image onto the beam splitter, utilizing the projection optical lens; and reflecting the light corresponding to the first digital image from the beam splitter in a first direction for viewing by an observer; and transmitting light from a scene through the beam splitter in the first direction.

15. The method of claim 10, further comprising focusing light onto the light filter utilizing a focusing optical lens.

16. A light analyzer device, comprising:

a light filter configured to receive light and to allow light within a predetermined wavelength range therein to pass through the light filter;

a focal plane array configured to receive the light that has passed through the light filter and to generate a first digital image based on the light that has passed through the light filter;

a microprocessor operably coupled to the focal plane array, the microprocessor configured to receive the first digital image, and to determine whether the first digital image corresponds to a stored digital image; and an electrical speaker operably coupled to the microprocessor, the microprocessor being further configured to induce the electrical speaker to output a sound indicating that the first digital image corresponds to the stored digital image, when the microprocessor determines the first digital image correspond to the stored digital image.

17. A light analyzer device, comprising:

a light filter configured to receive light and to allow light within a predetermined wavelength range therein to pass through the light filter;

a focal plane array configured to receive the light that has passed through the light filter and to generate a first digital image based on the light that has passed through the light filter;

a microprocessor operably coupled to the focal plane array, the microprocessor configured to receive the first digital image, and to determine whether the first digital image corresponds to a stored digital image; and a vibratable device operably coupled to the microprocessor, the microprocessor being further configured to induce the vibratable device to vibrate indicating that the first digital image corresponds to the stored digital image, when the microprocessor determines the first digital image corresponds to the stored digital image.

* * * * *